United States Patent
Tsutsumi et al.

(10) Patent No.: US 8,156,408 B2
(45) Date of Patent: Apr. 10, 2012

(54) DECODING APPARATUS, DECODING METHOD, AND STORAGE MEDIUM

(75) Inventors: Takayuki Tsutsumi, Kawasaki (JP); Hisashi Ishikawa, Urayasu (JP)

(73) Assignee: Canon Kabushiki Kaisha (JP)

( * ) Notice: Subject to any disclaimer, the term of this patent is extended or adjusted under 35 U.S.C. 154(b) by 425 days.

(21) Appl. No.: 12/605,048

(22) Filed: Oct. 23, 2009

(65) Prior Publication Data

US 2010/0107027 A1     Apr. 29, 2010

(30) Foreign Application Priority Data

Oct. 28, 2008   (JP) .................................. 2008-277375

(51) Int. Cl.
*G06F 11/00* (2006.01)
(52) U.S. Cl. ......... 714/779; 714/747; 714/752; 714/818
(58) Field of Classification Search .................. 714/747, 714/752, 779, 818
See application file for complete search history.

(56) References Cited

U.S. PATENT DOCUMENTS

| | | | | |
|---|---|---|---|---|
| 3,729,708 A | * | 4/1973 | Wolfer et al. ................. | 714/746 |
| 5,218,622 A | * | 6/1993 | Fazel et al. .................... | 375/240 |
| 5,528,755 A | * | 6/1996 | Beardsley et al. .............. | 714/48 |
| 5,638,370 A | * | 6/1997 | Seconi et al. ................. | 370/466 |
| 5,742,623 A | * | 4/1998 | Nuber et al. .................. | 714/798 |
| 6,212,663 B1 | * | 4/2001 | Kondo et al. .................. | 714/779 |
| 6,851,083 B1 | * | 2/2005 | Hagenauer et al. ........... | 714/774 |

FOREIGN PATENT DOCUMENTS

| JP | 5-227431 A | 9/1993 |
|---|---|---|
| JP | 2000-165877 A | 6/2000 |

* cited by examiner

*Primary Examiner* — Charles Ehne
(74) *Attorney, Agent, or Firm* — Rossi, Kimms & McDowell LLP

(57) ABSTRACT

A decoding apparatus acquires, from encoded data, a piece of additional bits that have been partly cut off, acquires, from the piece of the additional bits, the number of bits that are missing due to the cutting off as the number of missing bits, and restores the additional bits by reproducing the missing bits.

12 Claims, 12 Drawing Sheets

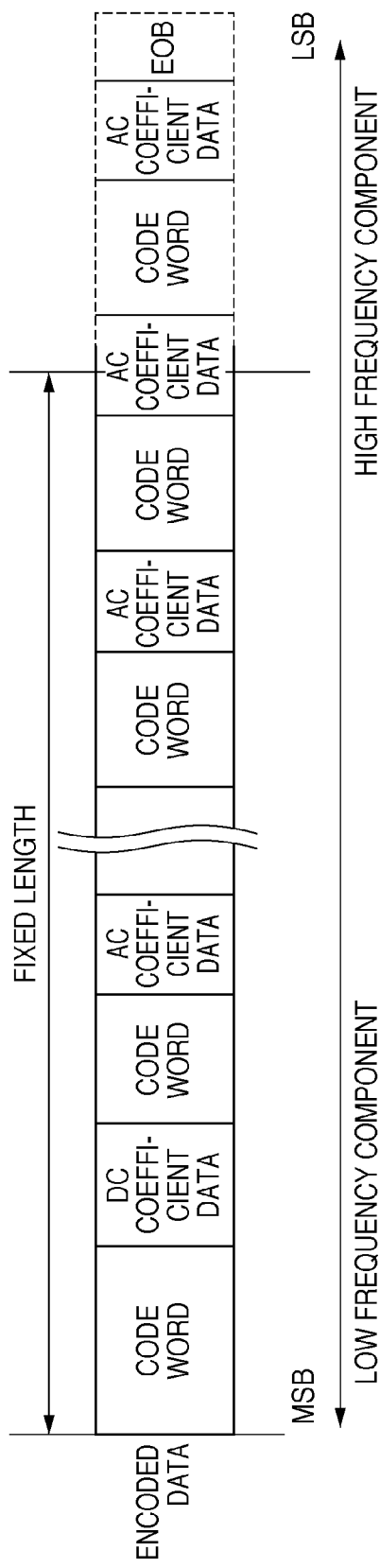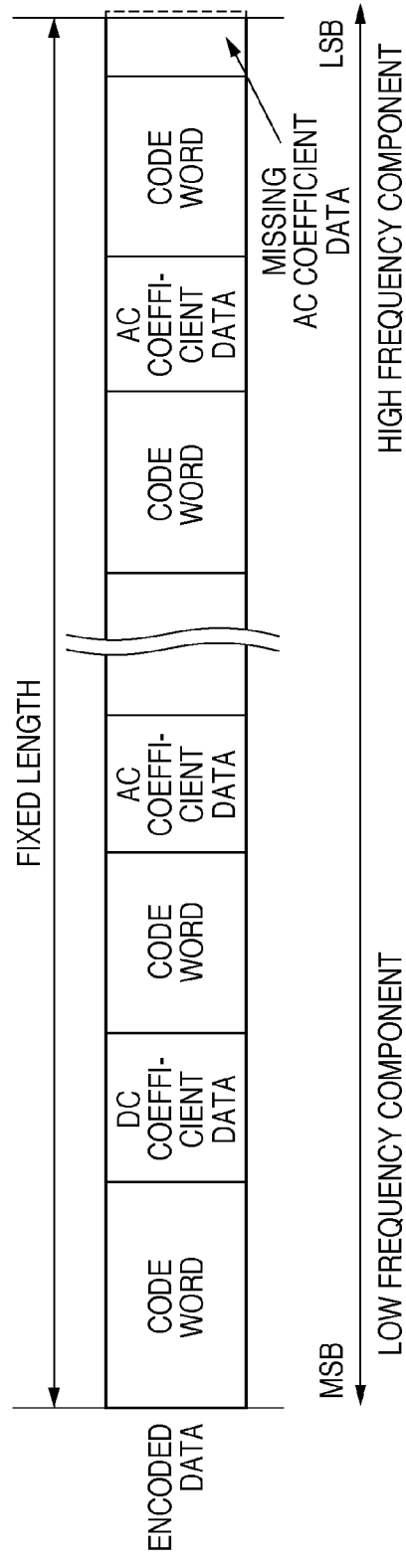

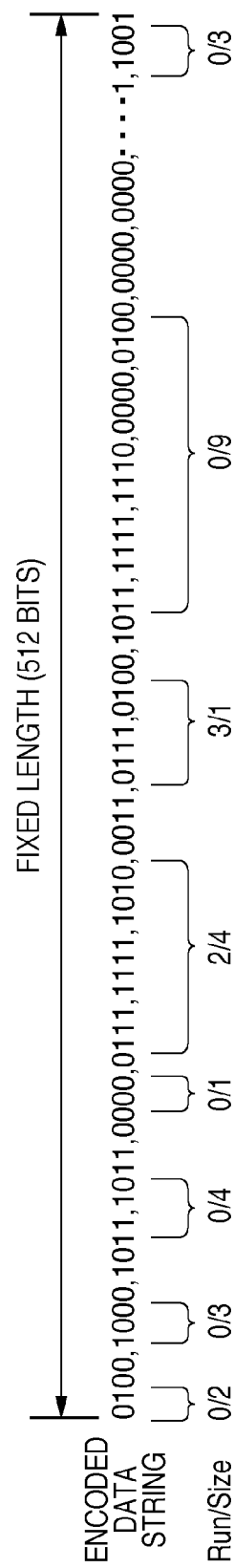

FIG. 5

| CODE WORD LENGTH | CODE WORD | ADDRESS |
|---|---|---|
| 4 | 1010(EOB) | 0 |
| 2 | 00 | 1 |
| 2 | 01 | 2 |
| 3 | 100 | 3 |
| 4 | 1110 | 4 |
| ... | ... | ... |
| 16 | 1111,1111,1000,0010 | 9 |
| ... | ... | ... |
| 12 | 1111,1111,0100 | 24 |
| ... | ... | ... |
| 6 | 111010 | 31 |
| ... | ... | ... |

FIG. 6

| ADDRESS | SYMBOL DATA (Run/Size) | ADDITIONAL BIT LENGTH |
|---|---|---|
| 0 | EOB | 0 |
| 1 | 0/1 | 1 |
| 2 | 0/2 | 2 |
| 3 | 0/3 | 3 |
| 4 | 0/4 | 4 |
| ... | ... | ... |
| 9 | 0/9 | 9 |
| ... | ... | ... |
| 24 | 2/4 | 4 |
| ... | ... | ... |
| 31 | 3/1 | 1 |
| ... | ... | ... |

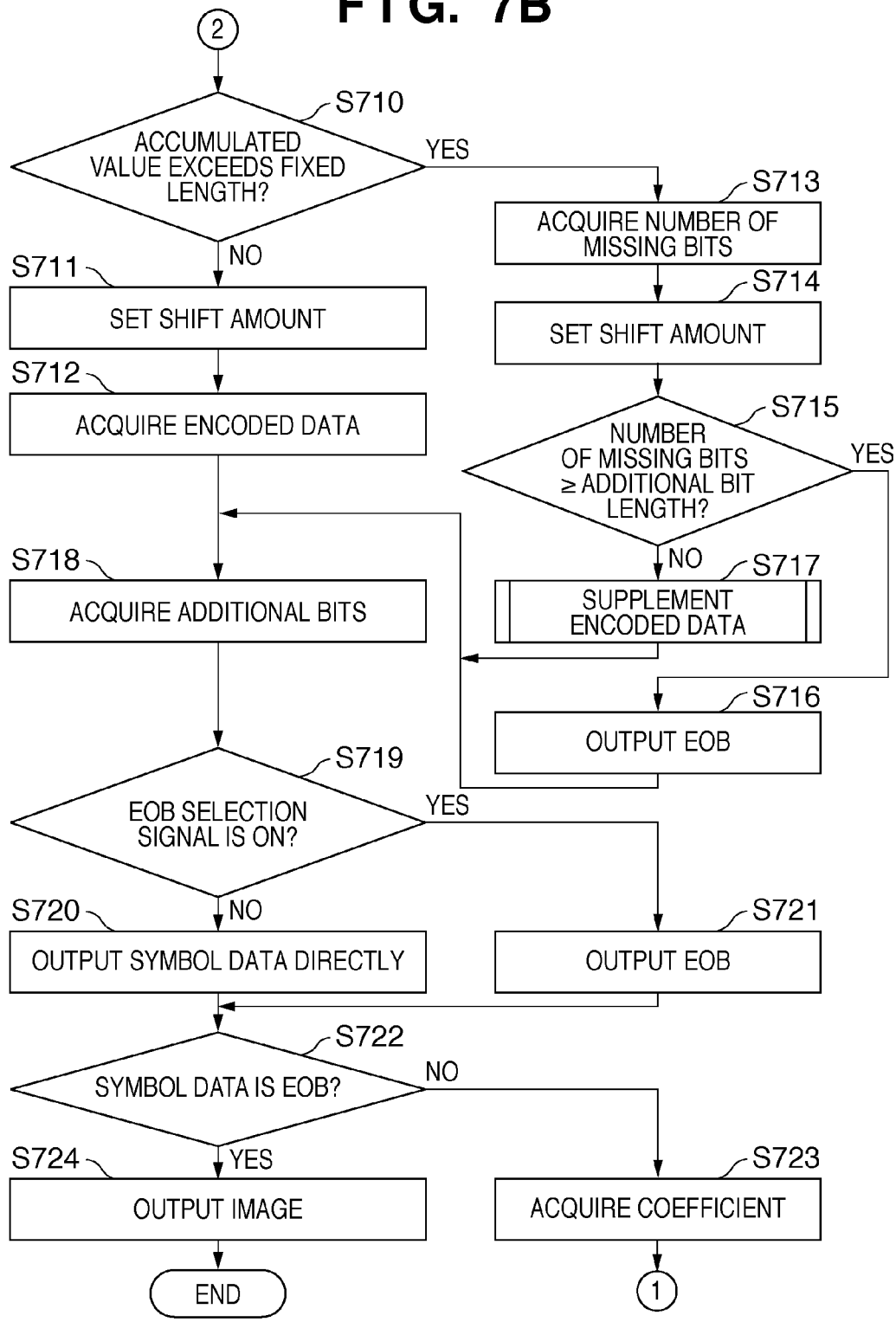

FIG. 10A
1001
FIG. 10B
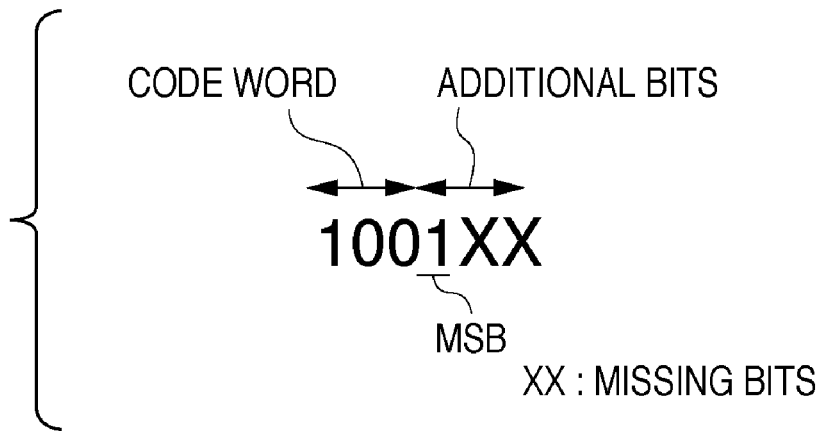
FIG. 10C
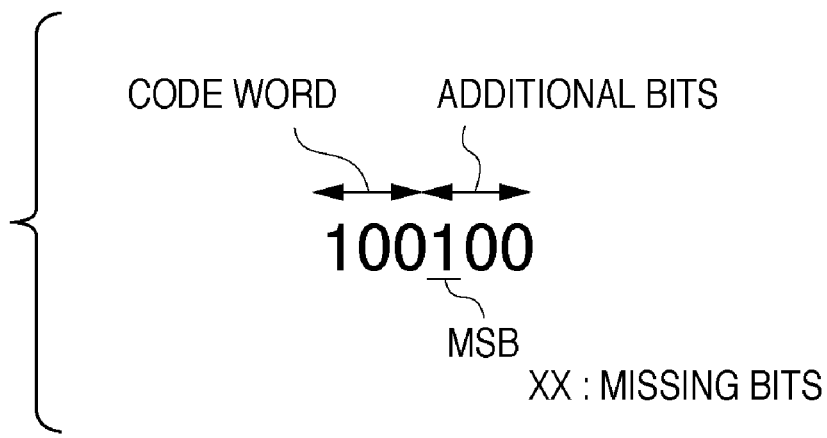

DECODING APPARATUS, DECODING METHOD, AND STORAGE MEDIUM

BACKGROUND OF THE INVENTION

1. Field of the Invention

The present invention relates to a technique for decoding coded data that has been truncated to a fixed length.

2. Description of the Related Art

In recent years, higher resolution and a larger number of bits have been demanded in the field of image processing in order to increase image quality. Image quality improves the more information an image has, but storage volume, data transfer time and the like increase as a result of an image having a large amount of information. In such a case, normally images are encoded in order to reduce storage volume.

One of the encoding methods is compression using an orthogonal transform typified by the JPEG encoding scheme. This method is generally known for having a high coding efficiency and little distortion with respect to images having a strong correlation between neighboring pixels and large transform coefficients in low frequency areas, such as natural images.

Also, with an image processing apparatus, processes such as rotating image data and then printing them need to be performed at high speed in a memory with limited capacity. Therefore, encoding technique that allows images of arbitrary portions of the encoded data to be easily obtained, without decoding all of the encoded data, from the encoded data compressed by orthogonal transformation and subsequent coding. That is, encoding that involves fixed-length truncation of the code amount in predetermined pixel units (blocks), and decoding independence (nature of being decodable only with data truncated to a fixed length). Hereinafter, truncation of the code amount in the predetermined pixel units (blocks) to a fixed length will be simply called fixed-length truncation, and the code amount in the predetermined pixel units (blocks) will be called a fixed length.

With fixed-length truncation, in the case where encoded data does not fit within the fixed length, the encoded data is adjusted so as to fit within the fixed length by omitting encoded data (hereinafter, referred to as a cutting off process). For example, when the data of FIG. 2, which has been obtained by encoding image data (not shown) with the JPEG encoding scheme, is truncated to a fixed length, the encoded data is adjusted to fit within the fixed length by omitting data on the LSB side of the encoded data as shown in FIG. 3. The reason for omitting data on the LSB side is because the higher frequency component information exists in the LSB side, and there is considered to be little effect on image quality from shortening high frequency AC coefficient data compared with DC coefficient data or low frequency AC coefficient data. Note that with JPEG, data is encoded separately as code words that are obtained by performing 2-dimensional Huffman coding on group numbers indicating the run length of zero coefficients and the range of coefficients (bit number of additional bits) and as additional bits that represent coefficient values.

In the case of decoding encoded data that has undergone the cutting off process, in the related art, a combination of a code word and additional bits with missing bits due to the cutting off process is decoded as a code word indicating EOB. For example, in the case of decoding the encoded data shown in FIG. 2, the additional bits with missing bits and the code word corresponding to the additional bits are decoded after being substituted for a code word indicating EOB as shown in FIG. 12. With the above related art, high frequency AC coefficient data are thus cut off with little image degradation effect, but even so image degradation occurs due to the effect of the cutting off process. In particular, image degradation appears markedly with images that include large high frequency components such as edges. As a measure for dealing with the above problem, in Japanese Patent Laid Open No. 5-227431, for example, a method is proposed for improving image quality by performing edge detection on a decoded image, and performing predetermined image processing if an edge is detected. Also, in Japanese Patent Laid Open No. 2000-165877, a proposal has been made whereby the Huffman coding process is forcibly cut off once the block code amount exceeds a preset code amount, and EOBt is placed at the end of the encoded data of the block. With the method of Japanese Patent Laid Open No. 2000-165877, a compensation process is performed whereby the code word EOBt, added at the time of encoding and indicating that encoding was cut off, is detected at the time of decoding, and edge blur is recovered with respect to the detected block image.

However, with the method of improving image quality disclosed in Japanese Patent Laid Open No. 5-227431, the edge detection accuracy itself is not good, since edges are extracted from a decoded image whose image quality has been degraded due to the cutting off process. Thus, block distortion or mosquito noise near an edge due to the effect of the cutting off process may conversely become noticeable.

Also, with the method disclosed in Japanese Patent Laid Open No. 2000-165877, a Huffman code (EOBt) indicating that encoding was cut off needs to be added to the encoded data. Thus, the code amount to undergo cutting off must be determined by subtracting the cutoff code word EOBt. Further, in order to add the information required in the process of recovering edge blur, the code amount to undergo cutting off is further reduced, and block distortion or mosquito noise near an edge due to the effect of the cutting off process cannot be effectively reduced. Also, because the cutoff code word and information required in the edge recovery process are added, the cutting off process becomes complicated (the code amount to undergo cutting off cannot be ascertained until the code amount of information required in the edge recovery process is ascertained).

SUMMARY OF THE INVENTION

The present invention provides a method that, even in the case where part of a code set constituting encoded data is missing, enables this code set to be restored and effectively used as part of the encoded data, when decoding encoded data such as JPEG encoded data, for example, including a code set constituted by a code word that indicates a group number and by additional information that is composed of bits, the first bit thereof indicating positive or negative, and that specifies one of decoding values belonging to the group specified by the code word.

In order to achieve the object of the present invention, a decoding apparatus according to the present invention is provided with the following configuration, for example. An input unit that inputs the encoded data; a decoding unit that decodes the encoded data in units of code sets; a detecting unit that detects, out of the input encoded data, an incomplete code set from which additional information is missing at least partly including the code word and the first bit of the additional information; and a supplying unit that generates an alternate code set that replaces the incomplete code set, based on the code word constituting the incomplete code set and on whether the first bit of the additional information constituting the incomplete code set indicates positive or negative, and supplies the generated alternate code set to the decoding unit.

Further features of the present invention will become apparent from the following description of exemplary embodiments with reference to the attached drawings.

BRIEF DESCRIPTION OF THE DRAWINGS

FIG. 2 is a diagram showing encoded data before fixed-length truncation in order to illustrate fixed-length truncation.

FIG. 3 is a diagram showing encoded data after fixed-length truncation in order to illustrate fixed-length truncation.

FIG. 4 is a diagram showing an exemplary input image that is output by a byte-operation circuit (not shown).

FIG. 5 is a diagram representing an exemplary code table.

FIG. 6 is a diagram representing a code table showing the correspondence between symbol data and the number of additional bits.

FIGS. 7A and 7B are flowcharts illustrating processing procedures according to the first embodiment.

FIGS. 10A, 10B and 10C are diagrams showing an exemplary operation of a restoring unit 106 according to the first embodiment.

DESCRIPTION OF THE EMBODIMENTS

Hereinafter, exemplary embodiments according to the present invention will be discussed in detail with reference to the drawings. The scope of the invention is, however, not limited to these embodiments.

First Embodiment

Figure 1:
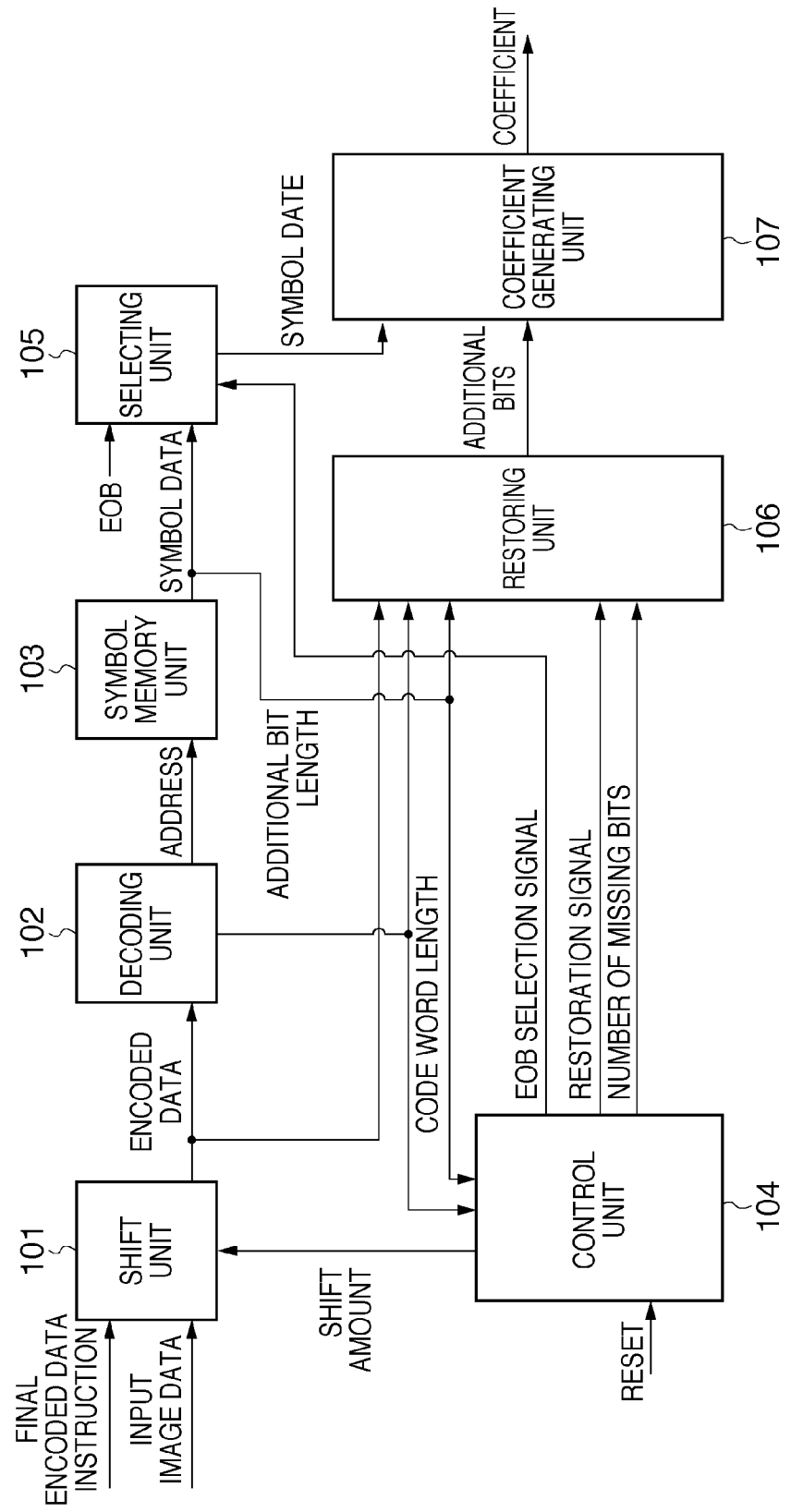
FIG. 1 is a block diagram representing a decoding apparatus according to a first embodiment.

FIG. 1 is a block configuration diagram of a decoding apparatus in a first embodiment. Note that because an encoding apparatus merely performs cutting off at a predetermined code amount, description thereof will be omitted.

Reference numeral 101 denotes a shift unit that acquires, from a byte-operation circuit (not shown), encoded data that has been truncated to a fixed length by cutting off an end of data constituted by combinations of a code word and additional bits that represent a frequency component. The shift unit 101 then outputs a bit string starting from the beginning of the acquired encoded data as cue data, and subsequently cues the next code word using a shift amount output from a control unit 104 and outputs a bit string starting from the cued code word as cue data. The byte-operation circuit is constituted by a circuit that is capable of cutting encoded data in units of bytes, and inputs fixed-length encoded data in units of bytes to the shift unit 101. For example, the byte-operation circuit cuts the encoded data ("01001000101110...") shown in FIG. 4 from the beginning in 1 byte (8 bit) units at any given time, and supplies the cut encoded data (e.g., the first 1 byte to be cut will be "01001000", i.e., "0x48"). Note that in the present embodiment, it is assumed that encoded data input by the byte-operation circuit to the shift unit 101 does not include a header or marker codes. That is, the byte-operation circuit or an input unit (not shown) that inputs encoded data to the byte-operation circuit supplies encoded data after having removed the header and the marker codes included in acquired data.

The shift unit 101 outputs cue data when the encoded data acquired from the byte-operation circuit in byte units reaches an amount that enables a coefficient to be extracted. Specifically, the shift unit 101 compares the sum of the maximum code word length and the maximum additional bit length shown in a code table (hereinafter, called the maximum valid bit length) with the number of bits from a designated bit of the encoded data acquired and held by the shift unit 101. The shift unit 101 then outputs encoded data starting from the designated bit as cue data when the number of bits from the designated bit is greater than or equal to the maximum valid bit length. In the present embodiment, the maximum code word length is 16 bits and the maximum additional bit length is 9 bits, as shown in the code tables of FIG. 5 and FIG. 6, so the maximum valid bit length is 25 bits (16 bits+9 bits). Thus, the shift unit 101 outputs cue data, when a bit string of 25 bits or more from the designated bit of the encoded data acquired by the shift unit 101 has accumulated. This comparison is performed because subsequent extraction needs to be performed after outputting a bit string of at least the maximum valid bit length, because of the possibility of not being able to completely extract a code word and additional data from a bit string of less than the maximum valid bit length. If the final encoded data instruction is "ON", however, the shift unit 101 outputs cue data even if the bit string from the designated bit is less than the maximum valid bit length. The byte-operation circuit, on completing the input of fixed-length encoded data to the shift unit 101, sets the final encoded data instruction to "ON". That is, cue data of less than the maximum valid bit length could be output near the end of the encoded data. This is to prevent the shift unit 101 not being able to output acquired encoded data and the end of the encoded data not being decoded, since the bit string from the designated bit may not reach the maximum valid bit length even if all of the encoded data is acquired. At this time, in order to prevent errors in a decoding unit 102, the shift unit 101 outputs the bit string after padding the bits of the portion that fell short of the maximum valid bit length with "1"s. Here, the bit string is padded with "1"s before being output because padding the deficient portion with "1"s ensures that a code word that has been cut off will not be decoded as a correct code word, since a code of 16 or more consecutive "1"s does not exist in JPEG. If, however, EOB is output in the case where the fixed length is exceeded as a result of a code length being accumulated as will be discussed below, or if a code word with a number of bits up to a value obtained by subtracting the accumulated value of the previous code length from the fixed length is detected, any value may be used to pad the deficient portion.

Reference numeral 102 denotes a decoding unit that detects a code word included at the beginning of the cue data, by comparing the cue data output by the shift unit 101 with the code words (Huffman codes) in a code table (see FIG. 5). The decoding unit 102 then decrypts the code word and derives a code word length of the code word and an address that corresponds to the code word. Being able to detect a code word indicates that the code word has not been partly cut off in the fixed-length truncation. The code table may be prestored or may be acquired externally. If a code word cannot be detected at the beginning of the cue data, the decoding unit 102 judges that the code word has been partly cut off in the fixed-length truncation, and disregards the partly cut off code word by outputting an address "0" indicating EOB (see FIG. 5). Also, even if a code word is detected, the decoding unit 102 judges that the acquired encoded data has been partly cut off if the code amount of the block is more than the fixed length, and outputs an address "0" indicating EOB (see FIG. 5).

Reference numeral 103 denotes a symbol memory unit that outputs symbol data and an additional bit length that correspond to the address acquired from the decoding unit 102 (see FIG. 6). Symbol data and additional bit lengths may be pre-stored per address by the symbol memory unit 103. Also, a code table showing symbol data and additional bit lengths corresponding to addresses may be acquired externally. In any case, it need only be possible to generate a code word length and an additional bit length from encoded data that has been cued, and output a two-dimensional Huffman code (symbol data) and additional bits separately.

Figure 9:
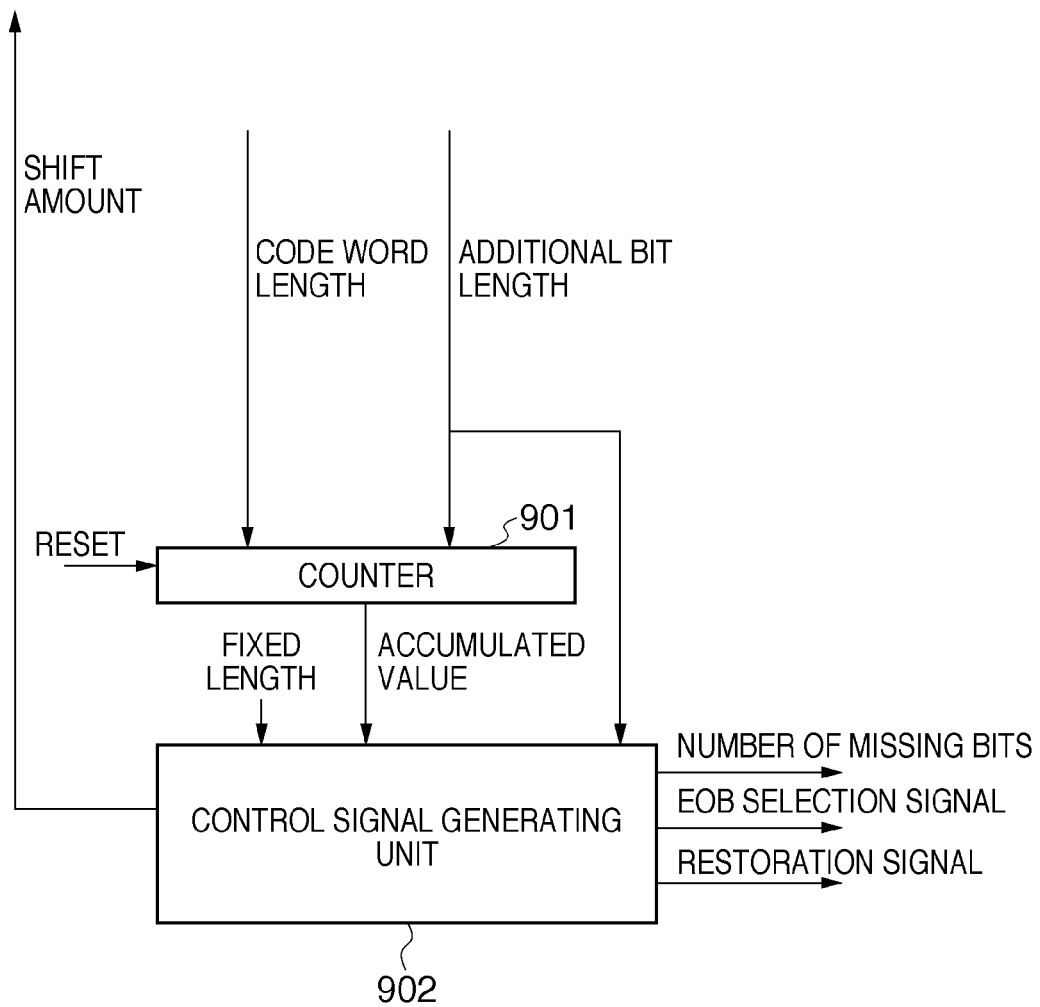
FIG. 9 is a diagram showing in detail a structure of a control unit 104 according to the first embodiment.

Reference numeral 104 denotes a control unit that is provided with a counter 901 and a control signal generating unit 902. Hereinafter, the operation of the control unit 104 will be described in detail using FIG. 9.

Reference numeral 901 denotes a counter that accumulates, with the same counter, code word lengths and additional bit lengths acquired from the decoding unit 102 and the symbol memory unit 103, and outputs an accumulated value. Note that once the decoding of one block ends, a reset signal is input and the accumulated value is initialized to "0".

Reference numeral 902 denotes a control signal generating unit that compares the accumulated value output by the counter 901 with a fixed length (e.g., 512 bits in the case of the encoded data string shown in FIG. 4). Here, the fixed length is assumed to have been set in advance by a CPU or the like. If the accumulated value is less than or equal to the fixed length, the control signal generating unit 902 judges that the combination of the code word and the additional bits cued by the shift unit 101 is not missing bits due to cutting off, and instructs the shift unit 101 to cue the next code word. Specifically, the control signal generating unit 902 inputs the (accumulated value+1)th bit from the beginning of the encoded data stored by the shift unit 101 to the shift unit 101 as the designated bit.

Conversely, if the accumulated value exceeds the fixed length, the control signal generating unit 902 judges that the combination of the code word and the additional bits cued by the shift unit 101 is missing bits due to cutting off, and performs the following processing. Firstly, the control signal generating unit 902 derives the difference between the accumulated value and the fixed length as the number of missing bits. Also, the control signal generating unit 902 sends a signal for starting a process of correcting lowermost data constituting the piece of the combination of the code word and the additional bits, included in the encoded data, from which some bits are missing due to cutting off. Specifically, the control signal generating unit 902 sends an EOB selection signal to a selecting unit if the number of missing bits is equal to the additional bit length or the number of missing bits is larger than the additional bit length, that is, if not even a 1 bit piece of the additional bits that are combined with the code word exists in the lowermost data. The case where the number of missing bits is larger than the additional bit length is equivalent to the case where the accumulated value exceeds the fixed length at the point when the code word length is accumulated. By sending the EOB selection signal to the selecting unit, the control signal generating unit 902 causes the selecting unit to convert the lowermost data to an EOB code. Also, if the number of missing bits is smaller than the additional bit length, that is, if at least a 1 bit piece of the additional bits exists in the lowermost data, the additional bits of the lowermost data have been partly cut off. That is, this lowermost data is targeted for decoding, and the control signal generating unit 902 sends a restoration signal to a restoring unit and causes the restoring unit to perform a process of supplementing the lowermost data.

Figure 11A:
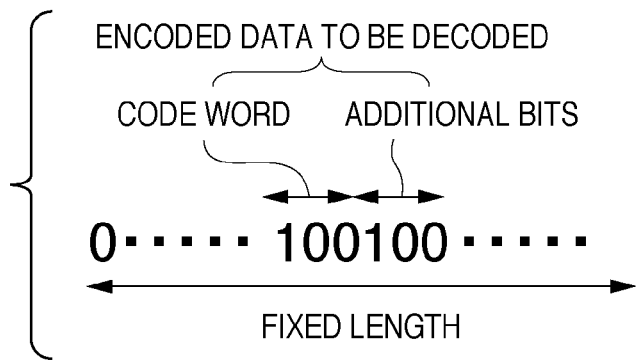
FIGS. 11A, 11B, 11C and 11D are diagrams showing respective encoded data corresponding to conditional branches of a control signal generating unit 902.
Figure 11B:
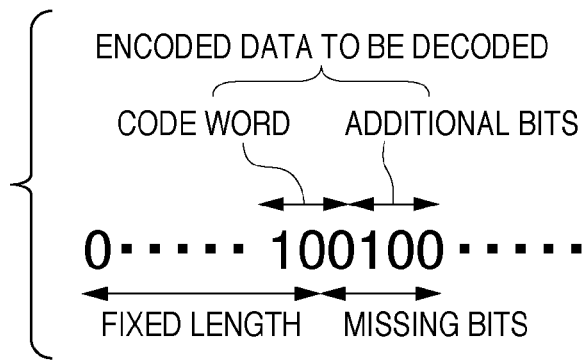
Figure 11C:
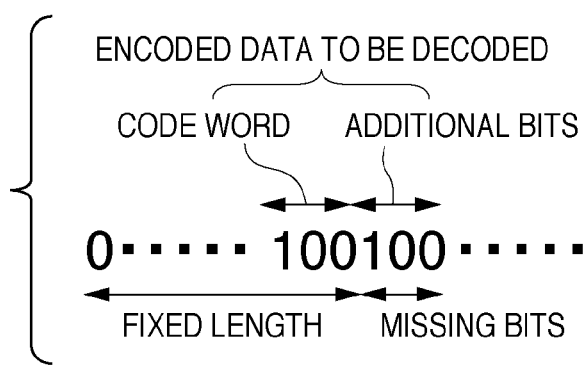
Figure 11D:
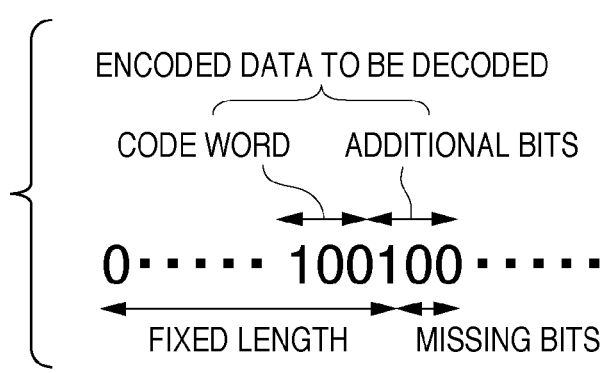
Figure 12:
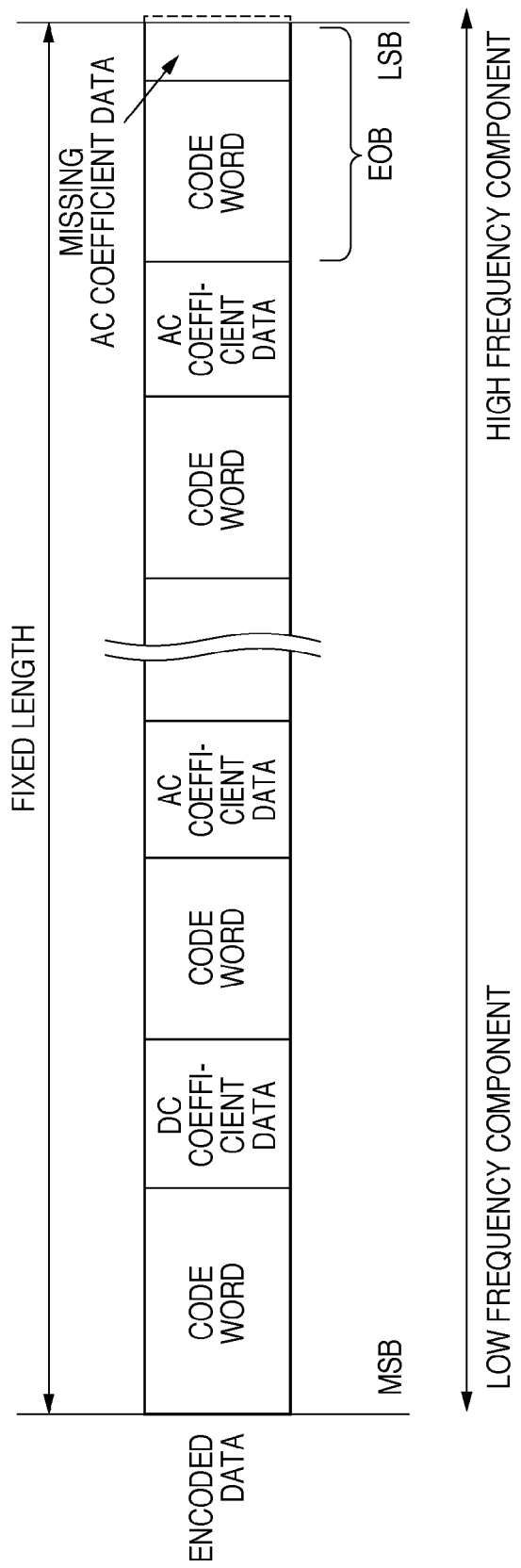
FIG. 12 is a diagram illustrating decoding according to the related art.

FIGS. 11A to 11D are diagrams showing exemplary encoded data corresponding to the above conditions. FIG. 11A represents exemplary encoded data in the case where the accumulated value is less than or equal to the fixed length, and represents a state where the combination of the code word and the additional bits that forms the decoding target is positioned within the fixed length. FIG. 11B represents a state where the code word, out of the combination of the code word and the additional bits that forms the decoding target, has undergone the cutting off process. FIG. 11C represents a state where all of the additional bits, out of the combination of the code word and the additional bits that forms the decoding target, have undergone the cutting off process. FIG. 11D represents a state where the additional bits were the cutoff target, out of the combination of the code word and the additional bits that forms the decoding target, and at least 1 bit of the additional bits exists without having been cut off. With FIG. 11B and FIG. 11C, because the additional bits cannot be reproduced, the control signal generating unit 902 outputs the EOB selection signal set to "ON". With FIG. 11D, because at least 1 bit of the additional bits exists without being cut off, the control signal generating unit 902 judges that the additional bits can be reproduced, and outputs the restoration signal set to "ON".

Reference numeral 105 denotes a selecting unit that, in the case where the EOB selection signal output by the control signal generating unit 902 is "ON", converts the symbol data acquired from the symbol memory unit 103 to symbol data indicating EOB, and outputs the converted symbol data. On the other hand, if the EOB selection signal is not "ON", the selecting unit 105 outputs the symbol data acquired from the symbol memory unit 103 directly. That is, the selecting unit 105 outputs symbol data indicating the EOB code and disregards the code word of the lowermost data, if not even a 1 bit piece of the additional bits exists in the lowermost data.

Reference numeral 106 denotes a restoring unit that corrects cue data acquired from the shift unit 101 according to an instruction from the control signal generating unit 902, and outputs the additional bits included in the cue data. The restoring unit 106 thus performs processing using the restoration signal and the number of missing bits acquired from the control signal generating unit 902, the code word length acquired from the decoding unit 102, and the additional bit length acquired from the symbol memory unit 103.

The restoring unit 106 refers to the restoration signal acquired from the control signal generating unit 902, and, if the restoration signal is not "ON", derives the additional bits from the cue data acquired from the shift unit 101 with reference to the code word length and additional bit length, and outputs the derived additional bits. The restoring unit 106 need only output the bits from the (code word length+1)th bit to the (code word length+additional bit length)th bit of the cue data as additional bits.

On the other hand, if the restoration signal is "ON", that is, if the acquired cue data is lowermost data and at least a 1 bit piece of the additional bits exists, the restoring unit 106 performs the following processing. According to this processing, the restoring unit 106 acquires the piece of the additional bits partly cut off, and generates and outputs new additional bits by adding bits to the piece of the additional bits existing at the tail of the lowermost data.

A method of generating additional bits includes firstly acquiring the MSB constituting the most significant bit of the piece of the additional bits in the lowermost data, from cue data which is lowermost data and the code word length. Specifically, the restoring unit 106 need only acquire the (code word length+1)th bit of the lowermost data as the MSB. Subsequently, the restoring unit 106 refers to the MSB, and, if the MSB is not "1" (MSB is "0"), or in other words, if the additional bits indicate a negative coefficient, adds "1" for the number of missing bits to the tail of the lowermost data. On the other hand, if the MSB is "1", or in other words, if the coefficient indicated by the additional data is positive, the restoring unit 106 adds "0" for the number of missing bits to the tail of the lowermost data. Finally, the restoring unit 106 derives the additional data from the lowermost data with reference to the code word length, and outputs the derived additional data to a coefficient generating unit 107. The restoring unit 106 need only output the bits from the (code word length+1)th bit to the tail of the lowermost data to which bits have been added, as additional data.

Next, an exemplary operation of the restoring unit 106 will be described with reference to FIGS. 10A to 10C. With this exemplary operation, the restoring unit 106 is assumed to have acquired the lowermost data shown in FIG. 10A. At this time, the code word length acquired from the decoding unit 102 will be "3", and the additional bit length acquired from the symbol memory unit 103 will be "3". In this case, the control signal generating unit 902 inputs the number of missing bits "2" and the restoration signal "ON" to the restoring unit 106. The restoring unit 106 judges that the MSB is "1", as shown in FIG. 10B, and adds two "0" to the tail of the lowermost data as shown in FIG. 10C. In the case of supplementing two missing bits to the additional bits, the four possibilities "100", "101", "110" and "111" are conceivable. Of these, the additional bits that will have the least effect on image quality are "100" (closest to 0), and the restoring unit 106 outputs these as the corrected lowermost data.

Reference numeral 107 denotes a coefficient generating unit that sequentially acquires combinations of the symbol data sequentially output by the selecting unit 105 and the additional bits sequentially output by the restoring unit 106, and sequentially generates coefficients representing the frequency component. Specifically, the coefficient generating unit 107, with reference to the run length indicated by the symbol data, outputs data bits "0" equal in number to the run length, and then outputs the additional bits. Coefficients are generated and output by repeating this process.

An output unit (not shown) decodes and displays an image from the coefficients output by the coefficient generating unit 107. For example, in the case of decoding JPEG data, the output unit is provided with an inverse-quantization unit, an inverse DCT unit and a display unit. The inverse-quantization unit (not shown) acquires the pre-inverse-quantization coefficients, and performs inverse-quantization based on a quantization table (not shown). The inverse DCT unit (not shown) then performs an inverse 2-dimensional discrete cosine transform on the data that was inversely quantized by the inverse-quantization unit, and the display unit (not shown) displays the decoded image.

Figure 7A:
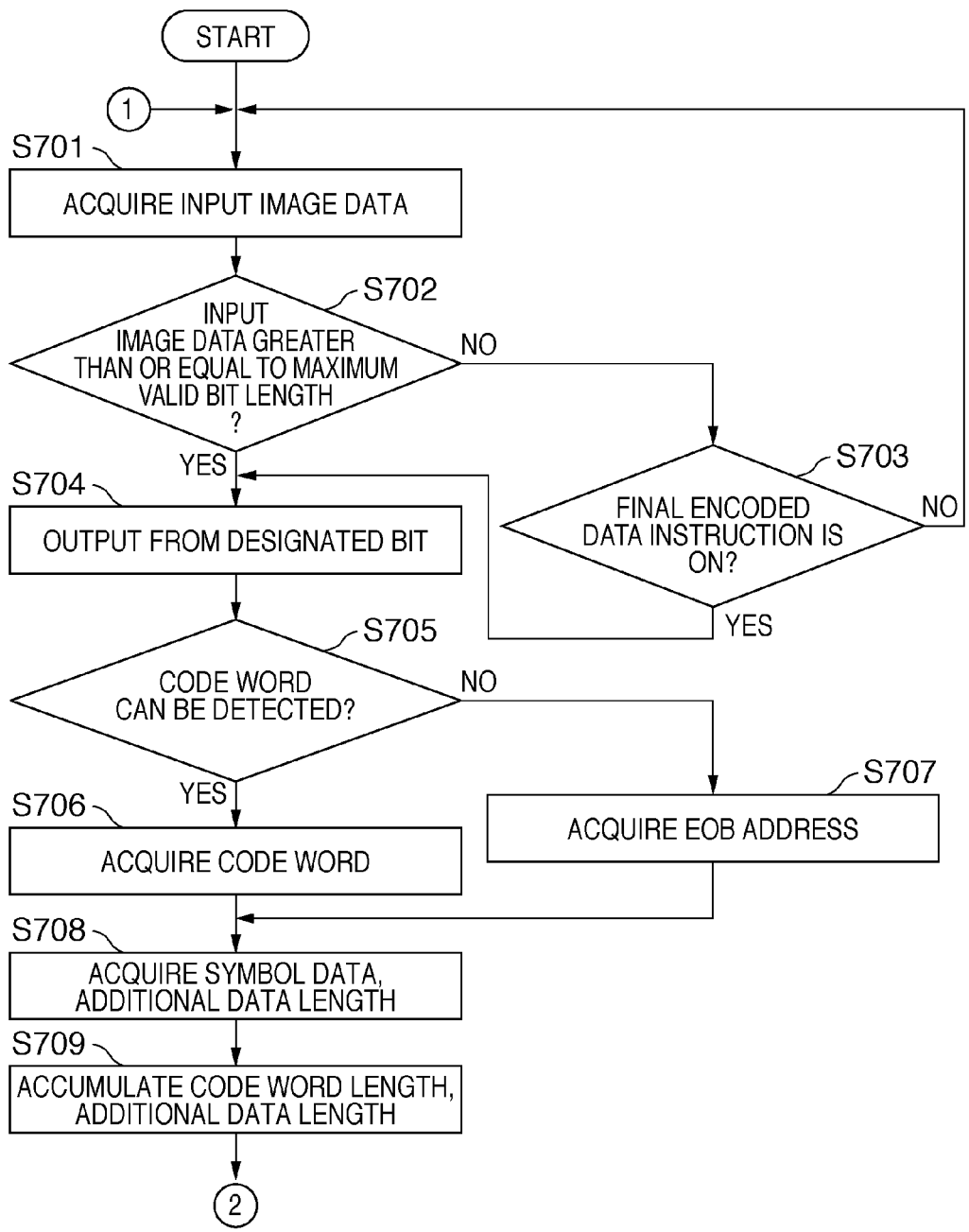

Next, the processing of the apparatus according to the present embodiment will be described in accordance with the flowcharts shown in FIGS. 7A and 7B.

In step S701, the shift unit 101 acquires encoded data from the byte-operation circuit (not shown), one byte at a time. At step S702, the shift unit 101 judges whether the length from the designated bit to the tail bit, out of the encoded data stored by the shift unit 101, is greater than or equal to the maximum valid bit length. If greater than or equal to a maximum valid bit length, the process proceeds to step S704. If less than the maximum valid bit length, the process proceeds to step S703.

At step S703, the shift unit 101 judges whether the final encoded data instruction is ON, and, if ON, the process proceeds to step S704. If not ON, the process returns to step S701, and again acquires encoded data.

At step S704, the shift unit 101 outputs data from the designated bit, out of the stored encoded data, as cue data. At step S705, the decoding unit 102 acquires the cue data output by the shift unit 101 at step S704, and searches for a code word existing at the beginning of the cue data using a code table. If a code word can be detected, the decoding unit 102, at step S706, acquires and outputs the address and the code word length of that code word. If a code word cannot be detected, the decoding unit 102, at step S707, outputs the address indicating the EOB code, and further outputs "0" as the code word length.

At step S708, the symbol memory unit 103 acquires symbol data and an additional data length using a code table, from the address output by the decoding unit 102 at step S706 or step S707, and outputs the acquired symbol data and additional data length. At step S709, the counter 901 accumulates the code word length output by the decoding unit 102 at step S706 or step S707 and the additional bit length output by the symbol memory unit 103 at step S708. At step S710, the control signal generating unit 902 compares the accumulated value obtained by the counter 901 at step S709 with the fixed length. If the accumulated value is less than or equal to the fixed length, the process proceeds to step S711, and if the accumulated value exceeds the fixed length, the process proceeds to step S713.

At step S711, the control signal generating unit 902 inputs the (accumulated value+1)th bit from the beginning of the stored encoded data to the shift unit 101 as the designated bit. Subsequently, at step S712, the restoring unit 106 acquires cue data from the shift unit 101, and the process proceeds to step S718.

At step S713, the control signal generating unit 902 derives the difference between the accumulated value and the fixed length as the number of missing bits. Also, at step S714, the control signal generating unit 902 inputs the (fixed length+1)th bit to the shift unit 101 as the designated bit. This process is for stopping the acquisition of cue data when data has been read to the end. At step S715, the control signal generating unit 902 compares the number of missing bits derived at step S713 with the additional bit length output by the symbol memory unit 103 at step S708. If the number of missing bits is equal to the additional bit length or the number of missing bits is larger than the additional bit length, the control signal generating unit 902 judges that not even 1 bit of the additional bits exists in the cue data, and the process proceeds to step S716. If the number of missing bits is smaller than the additional bit length, the control signal generating unit 902 judges that a piece of the additional bits exists in the cue data, and the process proceeds to step S717 with the restoration signal set to "ON". At step S716, the control signal generating unit 902 notifies the selecting unit 105 with the EOB selection signal set to "ON", and the process proceeds to step S718. At step S717, the restoring unit 106 recognizes that the restoration signal is "ON", and performs a process of supplementing the piece of the additional bits in the cue data with the additional bits that were cut off. The restoring unit 106 then acquires the cue data supplemented with the additional bits, and the process proceeds to step S718. The procedures of the process of supplementing additional data will be discussed in detail later.

At step S718, the restoring unit 106 acquires the additional bits from the cue data acquired at step S712 or step S717, using the code word length obtained from the decoding unit 102, and the additional bit length obtained from the symbol memory unit 103. At step S719, the selecting unit 105 judges whether the control signal generating unit 902 notified the EOB selection signal at step S716. If the EOB selection signal has not been notified, the selecting unit 105, at step S720, acquires the symbol data from the symbol memory unit 103, and outputs the acquired symbol data directly. If the EOB selection signal has been notified, the selecting unit 105, at step S721, outputs symbol data indicating the EOB code. At step S722, the coefficient generating unit 107 judges whether the symbol data output by the selecting unit 105 is symbol data indicating the EOB code. If the symbol data do not indicate the EOB code, the process proceeds to step S723. If the symbol data indicate the EOB code, the process proceeds to step S724.

At step S723, the coefficient generating unit 107 derives a coefficient from the symbol data output by the selecting unit 105 and the additional bits output by the restoring unit 106, and stores the derived coefficient. The processing then returns to step S701, and the reading of encoded data is continued.

At step S724, the output unit (not shown) decodes the image from the coefficients stored by the coefficient generating unit 107, and outputs the decoded image. According to the above processing, the object of the present invention is achieved.

Figure 8:
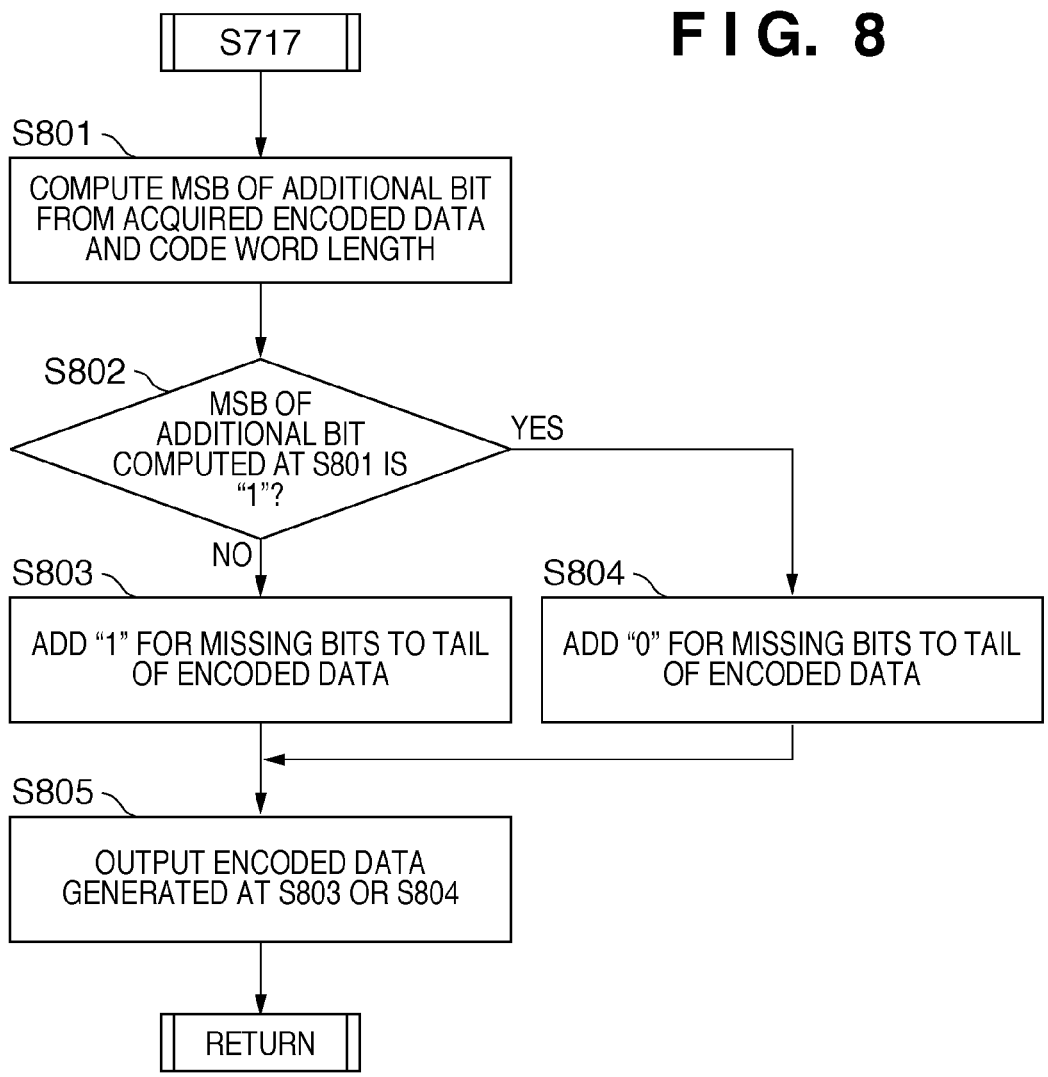
FIG. 8 is a flowchart illustrating in detail the operation of step S717 in FIG. 7B.

Next, the operation of the restoring unit 106 will be described using the flowchart of FIG. 8, with regard to the process of supplementing additional bits in step S717.

Firstly, the restoring unit 106 acquires the MSB constituting the most significant bit of the piece of the additional bits in the lowermost data, from the code word length and the cue data constituting the lowermost data (step S801). Specifically, the restoring unit 106 need only acquire the (code word length+1)th bit of the lowermost data as the MSB. Subsequently, the restoring unit 106 refers to the MSB acquired at step S801 (step S802). If the MSB is not "1" (MSB is "0"), or in other words, if the additional bits indicate a negative coefficient, the restoring unit 106 adds "1" for the number of missing bits to the tail of the lowermost data (step S803). On the other hand, if the MSB referred to at step S802 is "1", or in other words, if the coefficient indicated by the additional data is positive, the restoring unit 106 adds "0" for the number of missing bits to the tail of the lowermost data (step S804). Finally, the restoring unit 106 outputs the lowermost data to which bits have been added at step S803 or step S804 (step S805).

As described above, according to the present invention, additional bits from which some bits are missing due to the cutting off process in the fixed-length truncation are restored. Therefore, even if encoded data with respect to which cutting off has occurred in the fixed-length truncation is decoded, an image can be output with reduced block distortion and mosquito noise around an edge due to the effects of the cutting off. In particular, additional bits from which some bits are missing are restored to a coefficient closest to "0" (coefficient which has a positive or negative sign matching with the original coefficient before fixed-length truncation, and has the smallest absolute value out of possible coefficients). Image degradation due to the effects of cutting off can thus be minimized, without increasing mosquito noise or generating unnatural edges as a result of high frequency components of the image being emphasized.

As described above, in the present embodiment, symbol data and additional bits are acquired from encoded data after supplementing additional data that has been partly cut off, and then coefficients are acquired and the image is decoded. However, the configuration according to the present embodiment is not limited to this. For example, the decoding apparatus may be configured to perform a decoding process using encoded data obtained by concatenating "0" or "1" to bits that exceed the fixed length up to the maximum valid bit length to give two sets of additional bits, and select one of the sets of additional bits judging from the MSB of the piece of the additional bits. Alternatively, the decoding apparatus may be configured to reproduce additional bits that have been cut off using a plurality of suitable bit strings, and select the image with the least mosquito noise and block distortion from the decoded images.

Note that in the above embodiment, a technique for restoring additional bits from which some bits are missing due to fixed-length truncation of encoded data (cutting off process) is illustrated. However, this technique can also be applied in the case of restoring variable-length encoded data, rather than encoded data truncated to a fixed length. That is, the above technique can be adapted, even in the case of judging whether a final portion of variable-length encoded data is missing, and restoring those additional bits.

Also, even if data is missing in the middle of encoded data for some reason, rather than at the end of encoded data, the missing additional bits can be restored using the above-described technique. In this case also it does not particularly matter whether the encoded data to be decoded is entirely fixed-length encoded data or variable-length encoded data.

In the present embodiment, the focus is on being able to inferentially restore an "incomplete" code set including a code word and a first bit of the additional information and from which additional information is missing at least partly. Therefore, in the present embodiment, an "incomplete" code set including the code word and the first bit of the additional information and from which additional information is missing at least partly is detected out of encoded data to be decoded, and an alternate code set that replaces this incomplete code set is generated based on whether the code word and the first bit of the additional information constituting the incomplete code set indicate positive or negative. Here the image quality of the decoded image can be improved by supplying the generated alternate code set to the decoding unit.

Second Embodiment

In the first embodiment, the various units constituting the decoding apparatus shown in FIG. 1 are assumed to be implemented with hardware, but may also be implemented with software. In this case, the software is held in various types of storage apparatuses that are provided in a computer, and as a result of a CPU executing this software, the computer realizes the functions of the units shown in FIG. 1.

Figure 13:
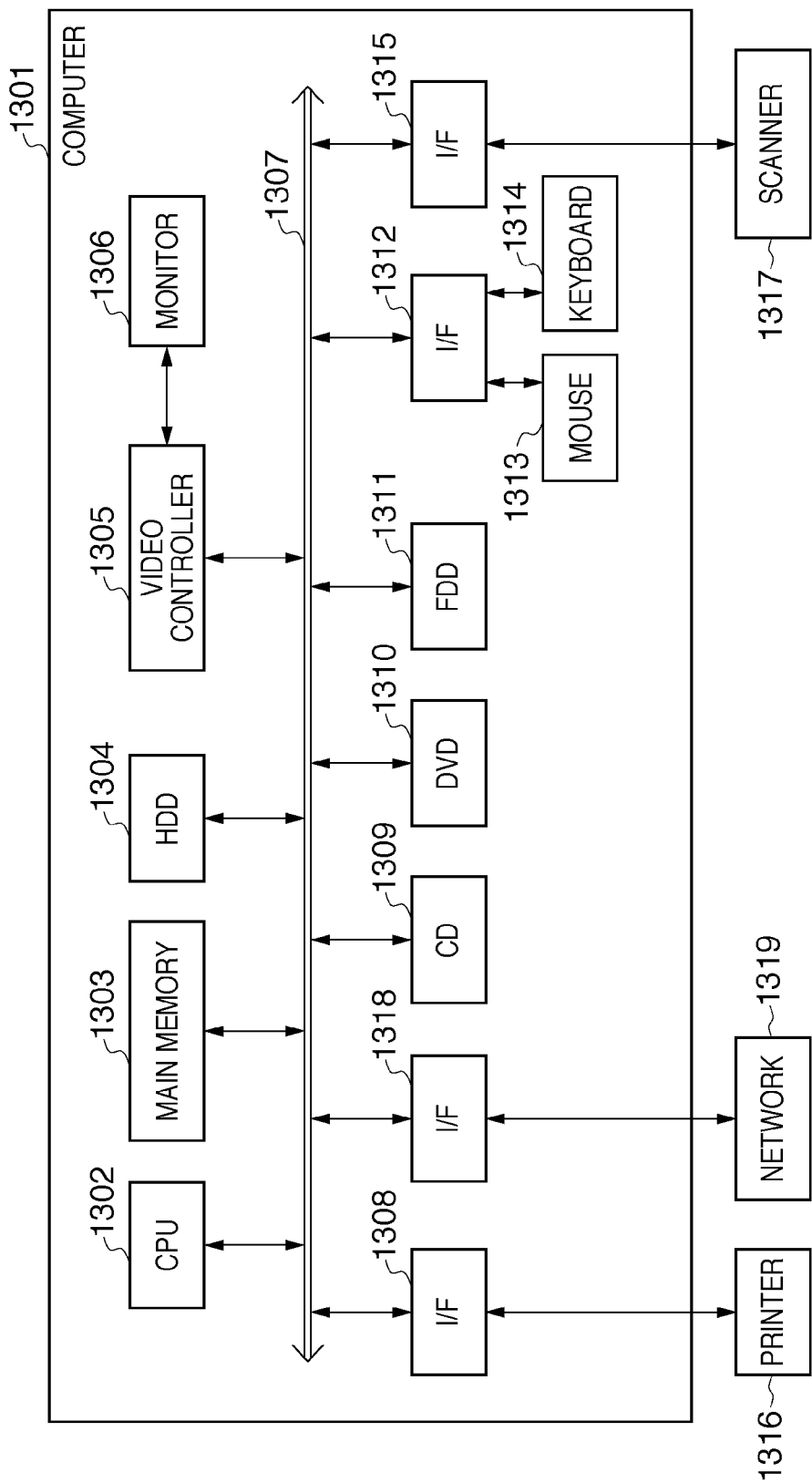
FIG. 13 is a block diagram showing an electrical structure of a computer according to a second embodiment.

FIG. 13 is a block diagram showing a hardware configuration of a computer to which the present embodiment is applicable. The computer 1301 is a general-purpose information processing apparatus such as personal computers in widespread use. In the computer 1301, blocks (described below) are connected by a bus 1307, enabling transfer of various data.

Note that because not all of the constituent elements shown in FIG. 13 are essential, depending on the apparatus applying the computer 1301, constituent elements may be appropriately omitted. Also, the computer 1301 may be replaced with hardware having the same type of functions, or may be constituted by a plurality of computer bodies.

In FIG. 13, reference numeral 1302 denotes a CPU that performs control of the entire computer 1301 using programs and data loaded into a main memory 1303, and executes the above-described processes that are performed by an image processing apparatus to which the computer 1301 is applied.

Reference numeral 1303 denotes a main memory typified by a RAM. The main memory 1303 has an area for temporarily storing programs and data read from various types of storage apparatuses. The storage apparatuses include an HDD (hard disk drive) 1304, a CD drive 1309, a DVD drive 1310, an FDD (Floppy® disk drive) 1311, and the like. Further the main memory 1303 also has an area for temporarily storing image data acquired from a scanner 1317 via an I/F (interface) 1315. Further the main memory 1303 also has a work area that is used when the CPU 1302 executes various types of processing. Including the above, the main memory 1303 is able to appropriately provide various types of information recording locations.

Reference numeral 1304 denotes an HDD that holds an OS (operating system) and various types of images (including document images). Further, programs and data for causing the CPU 1302 to control the functions of the units shown in FIG. 13, or for causing the CPU 1302 to execute the above-described processes that are performed by an image processing apparatus to which the computer 1301 is applied are saved in the HDD 1304. Programs and data held by the HDD 1304 are appropriately loaded into the main memory 1303 in accordance with the control of the CPU 1302, and become processing targets of the CPU 1302. Note that some of the information described as being stored in the main memory 1303 may be saved on the HDD 1304.

Reference numeral 1305 denotes a video controller that delivers display data such as image data and character data received from the main memory 1303, the HDD 1304 or the like to a monitor 1306 as signals. The monitor 1306 is constituted by a CRT, a liquid crystal display or the like, and displays images, characters and the like that are based on the signals received from the video controller 1305.

Reference numeral 1308 denotes an I/F for connecting a printer 1316 to the computer 1301. The computer 1301 is able to transmit print data to the printer 1316 via this I/F 1308, and receive status information of the printer 1316 transmitted by the printer 1316.

Reference numeral 1309 denotes a CD drive that reads out a program or data recorded on a CD serving as a storage medium, and delivers the read program or data to the HDD 1304, the main memory 1303, or the like.

Reference numeral 1310 denotes a DVD drive that reads out a program or data recorded on a DVD serving as a storage medium, and delivers the read program or data to the HDD 1304, the main memory 1303, or the like.

Reference numeral 1311 denotes an FDD that reads out a program or data recorded on a Floppy® disk serving as a storage medium, and delivers the read program or data to the HDD 1304, the main memory 1303, or the like.

Reference numerals 1313 and 1314 respectively denote a mouse and a keyboard serving as input apparatuses. The user of the computer 1301 is able to input various types of instructions to the CPU 1302, by operating the mouse 1313 and the keyboard 1314.

Reference numeral 1312 denotes an I/F for connecting the keyboard 1314 and the mouse 1313 to the bus 1307. Instructions input by the user from the mouse 1313 and the keyboard 1314 are delivered to the CPU 1302 via the I/F 1312 as signals.

Reference numeral 1315 denotes an I/F for connecting the scanner 1317, which generates image data by reading originals, film and the like, to the computer 1301. Image data generated by the scanner 1317 is delivered to the HDD 1304, the main memory 1303 or the like via this I/F 1315.

Reference numeral 1318 denotes an I/F for exchanging information with electronic devices such as other computers. Information including image data acquired from a network 1319 as a result of an instruction from the CPU 1302 is delivered to the HDD 1304, the main memory 1303 or the like via this I/F 1318.

Other Embodiments

Aspects of the present invention can also be realized by a computer of a system or apparatus (or apparatuses such as a CPU or MPU) that reads out and executes a program recorded on a memory apparatus to perform the functions of the above-described embodiments, and by a method, the steps of which are performed by a computer of a system or apparatus by, for example, reading out and executing a program recorded on a memory apparatus to perform the functions of the above-described embodiments. For this purpose, the program is provided to the computer for example via a network or from a recording medium of various types serving as the memory apparatus (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-277375, filed on Oct. 28, 2008, which is hereby incorporated by reference herein in its entirety.

What is claimed is:

1. A decoding apparatus for decoding encoded data including a code set constituted by a code word that indicates a group number and by additional information that is composed of bits, wherein a first bit of the additional information indicates positive or negative, and the additional information specifies one of decoding values belonging to a group specified by the code word, comprising:
    an input unit that inputs the encoded data;
    a decoding unit that decodes the encoded data in units of code sets;
    a detecting unit that detects, out of the input encoded data, an incomplete code set from which additional information is missing at least partly including the code word and the first bit of the additional information; and
    a supplying unit that generates an alternate code set that replaces the incomplete code set, based on the code word constituting the incomplete code set and on whether the first bit of the additional information constituting the incomplete code set indicates positive or negative, and supplies the generated alternate code set to the decoding unit.

2. A decoding apparatus for decoding encoded data of a preset fixed bit length L, and including a code set constituted by a code word that indicates a group number and by additional information that is composed of bits, wherein a first bit of the additional information indicates positive or negative, and the additional information is of a number of bits indicated by a group specified by the code word, comprising:
    an input unit that inputs the encoded data;
    a decoding unit that decodes the encoded data in units of code sets;
    a determining unit that extracts the code set from a beginning of the encoded data input by the input unit, determines whether a final bit position of the extracted code set of interest is at or before the fixed length L, and, if the final bit position of the extracted code set of interest is after the fixed length L, determines whether a first bit position of the additional information included in the extracted code set of interest is at or before the fixed length L;

a first supplying unit that, if a determination result of the determining unit indicates that the final bit position of the extracted code set of interest is at or before the fixed length L, supplies the extracted code set of interest to the decoding unit; and a second supplying unit that, if a determination result of the determining unit indicates that the final bit position of the extracted code set of interest is after the fixed length L, and that the first bit position of the additional information included in the extracted code set of interest is at or before the fixed length L, generates an alternate code set that replaces the code set of interest, and supplies the generated alternate code set to the decoding unit, wherein the second supplying unit judges how many bits of additional information are missing, from the group specified by the code word of the code set of interest, generates additional information capable of being represented with non-missing bits, and supplies the code word followed by the generated additional information to the decoding unit as the alternate code set.

3. A decoding apparatus for decoding an image from encoded data truncated to a fixed length when the image was encoded by cutting off an end of data including a combination of a code word and additional bits that represent a frequency component, comprising:

decrypting means for acquiring, from the encoded data, a piece of the additional bits that have been partly cut off; and correcting means for acquiring, from the piece of the additional bits, a number of bits missing due to the cutting off, as a number of missing bits, and restores the additional bits by reproducing the missing bits, wherein the correcting means reproduces the additional bits by adding "0" for the number of missing bits to a tail of the piece of the additional bits if an MSB, which is a most significant bit of the piece of the additional bits from which bits are missing due to the cutting off, is "1", and by adding "1" for the number of missing bits to the tail of the piece of the additional bits if the MSB is "0".

4. The decoding apparatus according to claim 3, further comprising coefficient generating means, wherein the decrypting means acquires symbol data by decrypting a combination of a code word and additional bits, which is included in the encoded data and has not been partly cut off, and outputs the acquired symbol data together with the additional bits, and, if a code word that has been partly cut off is detected in the encoded data, disregards the code word, the correcting means, if a code word for which additional bits combined therewith do not exist is detected in the encoded data, disregards the code word, and, if a code word that is combined with the piece of the additional bits is detected, outputs the symbol data decrypted from the code word together with the restored additional bits, and the coefficient generating means sequentially generates coefficients representing a frequency component, from the combinations of symbol data and additional bits sequentially output by the decrypting means or the correcting means, and outputs the generated coefficients.

5. The decoding apparatus according to claim 4, further comprising means for acquiring a code table indicating a code word length of the code word and an additional bit length and symbol data that correspond to the code word, wherein the decrypting means includes:

shift means for acquiring a bit string starting from a beginning of the encoded data as cue data, subsequently receives input of a designated bit and acquires a bit string starting from the designated bit of the encoded data as cue data, decrypts a code word positioned at the beginning of the cue data in accordance with the code table and outputs a code word length of the code word and both an additional bit length and symbol data that correspond to the code word, and, if the code word has been partly cut off and cannot be decrypted, disregards the code word by outputting symbol data indicating an EOB code; and control means for acquiring an accumulated value by accumulating the code word length and the additional bit length in order, inputting an (accumulated value+1)th bit from the beginning of the encoded data to the shift means as the designated bit, having judged that the combination of the code word and the additional bits have no missing bits due to the cutting off if the accumulated value is less than or equal to a fixed length, and causing the correcting means to start processing, having judged that the combination of the code word and the additional bits is missing at least partly due to the cutting off if the accumulated value exceeds the fixed length.

6. The decoding apparatus according to claim 5, wherein if a code word for which additional bits combined therewith do not exist is detected in the encoded data, or the accumulated value exceeds the fixed length when the code word length is accumulated, the correcting means disregards the code word by outputting symbol data indicating the EOB code.

7. The decoding apparatus according to claim 5, wherein the correcting means acquires a difference between the accumulated value and the fixed length as the number of missing bits.

8. A decoding method for decoding encoded data including a code set constituted by a code word that indicates a group number and by additional information that is composed of bits, wherein a first bit of the additional information indicates positive or negative, and the additional information specifies one of decoding values belonging to a group specified by the code word, comprising:

an inputting step of inputting the encoded data;

a decoding step of decoding the encoded data in units of code sets;

a detecting step of detecting, out of the input encoded data, an incomplete code set from which additional information is missing at least partly including the code word and the first bit of the additional information; and a supplying step of generating an alternate code set that replaces the incomplete code set, based on the code word constituting the incomplete code set and on whether the first bit of the additional information constituting the incomplete code set indicates positive or negative, and supplying the generated alternate code set to the decoding step.

9. A decoding method performed by a decoding apparatus for decoding encoded data of a preset fixed bit length L and including a code set constituted by a code word that indicates a group number and by additional information that is composed of bits, wherein a first bit of the additional information indicates positive or negative, and the additional information is of a number of bits indicated by a group specified by the code word, comprising:

an inputting step of inputting the encoded data;

a decoding step of decoding the encoded data in units of code sets;

a determining step of extracting the code set from a beginning of the encoded data input in the input step, determining whether a final bit position of the extracted code set of interest is at or before the fixed length L, and, if the final bit position of the extracted code set of interest is after the fixed length L, determining whether a first bit position of the additional information included in the code set of interest is at or before the fixed length L;

a first supplying step of, if a determination result in the determining step indicates that the final bit position of the code set of interest is at or before the fixed length L, supplying the code set of interest to the decoding step; and a second supplying step of, if a determination result in the determining step indicates that the final bit position of the code set of interest is after the fixed length L, and that the first bit position of the additional information included in the code set of interest is at or before the fixed length L, generating an alternate code set that replaces the code set of interest, and supplying the generated alternate code set to the decoding step, wherein in the second supplying step, how many bits of additional information are missing is judged from the group specified by the code word of the code set of interest, additional information capable of being represented with non-missing bits is generated, and the code word followed by the generated additional information is supplied to the decoding step as the alternate code set.

10. A decoding method performed by a decoding apparatus provided with means for decoding an image from encoded data truncated to a fixed length when the image was encoded by cutting off an end of data including a combination of a code word and additional bits that represent a frequency component, comprising:

a decrypting step of acquiring, from the encoded data, a piece of the additional bits that have been partly cut off; and a correcting step of acquiring, from the piece of the additional bits, a number of bits missing due to the cutting off, as a number of missing bits, and restoring the additional bits by reproducing the missing bits, wherein in the correcting step, the additional bits are reproduced by adding "0" for the number of missing bits to a tail of the piece of the additional bits if an MSB, which is a most significant bit of the piece of the additional bits from which bits are missing due to the cutting off, is "1", and by adding "1" for the number of missing bits to the tail of the piece of the additional bits if the MSB is "0".

11. A computer-readable storage medium storing a computer program for causing a computer to function as means of the decoding apparatus claimed in claim 1.

12. A computer-readable storage medium storing a computer program for causing a computer to function as means of the decoding apparatus claimed in claim 2.

* * * * *